US005568047A

United States Patent [19]

Staver et al.

[11] Patent Number: 5,568,047

[45] Date of Patent: Oct. 22, 1996

[54] CURRENT SENSOR AND METHOD USING DIFFERENTIALLY GENERATED FEEDBACK

[75] Inventors: Daniel A. Staver, Scotia; Juha M. Hakkarainen, Delmar, both of N.Y.

[73] Assignee: General Electric Company, Schenectady, N.Y.

[21] Appl. No.: 288,177

[22] Filed: Aug. 10, 1994

[51] Int. Cl.[6] .................. G01R 33/00

[52] U.S. Cl. .................. 324/127; 324/117 R

[58] Field of Search .................. 324/127, 117 R, 324/117 H, 74; 336/212, 176, 223, 174; 364/550, 551.01, 571.01

[56] References Cited

U.S. PATENT DOCUMENTS

| | | | |
|---|---|---|---|
| 3,955,138 | 5/1976 | Milkovic | 324/127 |
| 4,198,595 | 4/1980 | Milkovic | 324/127 |
| 4,482,862 | 11/1984 | Leehey | 324/117 R |
| 4,500,838 | 2/1985 | Bloomer | 324/117 R |
| 4,616,174 | 10/1986 | Jorgensen | 324/127 |
| 4,761,605 | 8/1988 | Jochum | 324/142 |
| 5,066,904 | 11/1991 | Bullock | 324/127 |

OTHER PUBLICATIONS

Patent Abstracts of Japan, vol. 15, No. 433 (P–1271) Nov. 5, 1991, pp. 1/1.

*Primary Examiner*—Vinh P. Nguyen
*Attorney, Agent, or Firm*—Marvin Snyder

[57] ABSTRACT

A current sensor has one signal interface channel including a transformer having a primary winding, a secondary winding and a feedback winding. A magnetic core magnetically couples the primary winding, the secondary winding and the feedback winding. The current sensor further includes a feedback generating circuit responsive to an AC signal in the secondary winding for generating a feedback signal having a continuous polarity supplied to the feedback winding. The feedback signal being effective for maintaining a flux in the magnetic core substantially near zero. The feedback generating circuit is made up of an operational amplifier, such as an amplifier having first and second differential input ports and first and second differential output ports, and a switching assembly designed to generate a compensating AC signal from a DC offset voltage. The compensating AC signal is conveniently coupled to the operational amplifier through the magnetic core.

18 Claims, 4 Drawing Sheets

CURRENT SENSOR AND METHOD USING DIFFERENTIALLY GENERATED FEEDBACK

BACKGROUND OF THE INVENTION

The present invention relates to current sensors and, more particularly, to a differential technique for overcoming offset voltages in an amplifier employed to provide feedback compensation in a transformer of a current sensor.

Many electrical and electronic devices, such as induction and electronic-type watthour meters for metering electric power and energy usage, require means for sensing line or load current components flowing in a conductor, and producing a current measurement signal which is accurately proportional over a large range of magnitudes of the load current.

The load current is typically many times the value of the current measurement signal appropriate for use in an electronic metering device. In some systems, the load current is as much as 10,000 times larger than the desired current measurement signal. It is convenient to employ a transformer, such as a current transformer, wherein a relatively small number of turns (e.g., one or two) about a toroidal core serve as a primary transformer winding carrying the load current. A secondary winding of many turns has induced therein a current proportional to the load current but reduced by the primary-to-secondary turns ratio of the transformer.

Transformers are prone to core saturation in the presence of large load currents. Core saturation is generally avoided by using large cores and making the cores of high-quality materials. Unfortunately, both large size and high-quality materials result in high cost.

Prior techniques for avoiding core saturation include providing a feedback winding about the core carrying a feedback current signal just sufficient to maintain the core flux near zero. Limiting the core flux near zero permits using smaller cores and cheaper core materials. As the load current changes, the feedback current signal also changes just enough to maintain the core flux near zero so that each different level of load current can be accommodated without inducing core saturation in the transformer.

The active feedback employed in the foregoing technique is generated by an operational amplifier receiving the output of the secondary winding of the transformer. The typical high gain of an operational amplifier allows for producing an output current readily capable of maintaining near zero flux in the core. The high gain of the operational amplifier, however, leads to a further complication. As will be appreciated by those skilled in the art, coupling between the feedback winding and the secondary winding of the transformer is only effective for alternating current (AC). Them is no direct current (DC) feedback coupling to, the input of the operational amplifier. Thus, DC offset voltages of, for example, a fraction of a millivolt, may appear or develop at the input of the operational amplifier. Typical operational amplifiers have DC gains on the order of several million. As a consequence, any offset voltage, even a fraction of a millivolt, at the input of the operational amplifier can drive the operational amplifier to saturation.

U.S. Pat. No. 4,761,605, assigned to the assignee of the present invention and herein incorporated by reference, describes a feedback circuit which employs a single-ended operational amplifier and chopping switches to convert the response to any DC offset voltage into an AC component which in turn is coupled between the feedback and secondary windings of the transformer in order to provide DC compensation. Although the foregoing U.S. Pat. No. 4,761,605 is effective in providing the desired DC compensation, the feedback circuit employed therein causes discontinuous polarity reversal in the desired measurement signal and this necessitates additional synchronization or signal polarity "bookkeeping" in order to filter out or remove such discontinuous polarity reversal from the measurement signal. Further, since the feedback circuit may comprise an integrated circuit chip and the current sensor may have to handle multiple current and/or voltage interface channels, it is desirable to reduce the number of connect pins required per signal interface channel in the current sensor.

SUMMARY OF THE INVENTION

Generally speaking, the present invention fulfills the foregoing; needs by providing a current sensor having at least one signal interface channel comprising a transformer having a primary winding, a secondary winding and a feedback winding. A magnetic core magnetically couples the primary winding, the secondary winding and the feedback winding. The current sensor further comprises a feedback generating circuit responsive to an AC signal in the secondary winding for generating a substantially continuous feedback signal supplied to the feedback winding. The feedback signal is effective for maintaining a flux in the magnetic core substantially near zero. The feedback generating circuit in mm comprises an operational amplifier, such as an amplifier having first and second differential input ports and first and second differential output ports, and a switching assembly adapted to generate a compensating AC signal from a DC offset voltage. The compensating AC signal is coupled to the operational amplifier through the magnetic core.

A method for signal compensation in a current sensor may comprise the steps of magnetically coupling a primary winding, a secondary winding and a feedback winding using a magnetic core; generating a substantially continuous feedback signal being supplied to the feedback winding and being effective for maintaining a magnetic flux substantially near zero; and generating a compensating AC signal from a DC offset voltage. The compensating signal is predeterminedly coupled through the magnetic core.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the, accompanying drawings in which like numbers represent like pans throughout the drawings, and in which:

DETAILED DESCRIPTION OF THE INVENTION

Figure 1A:
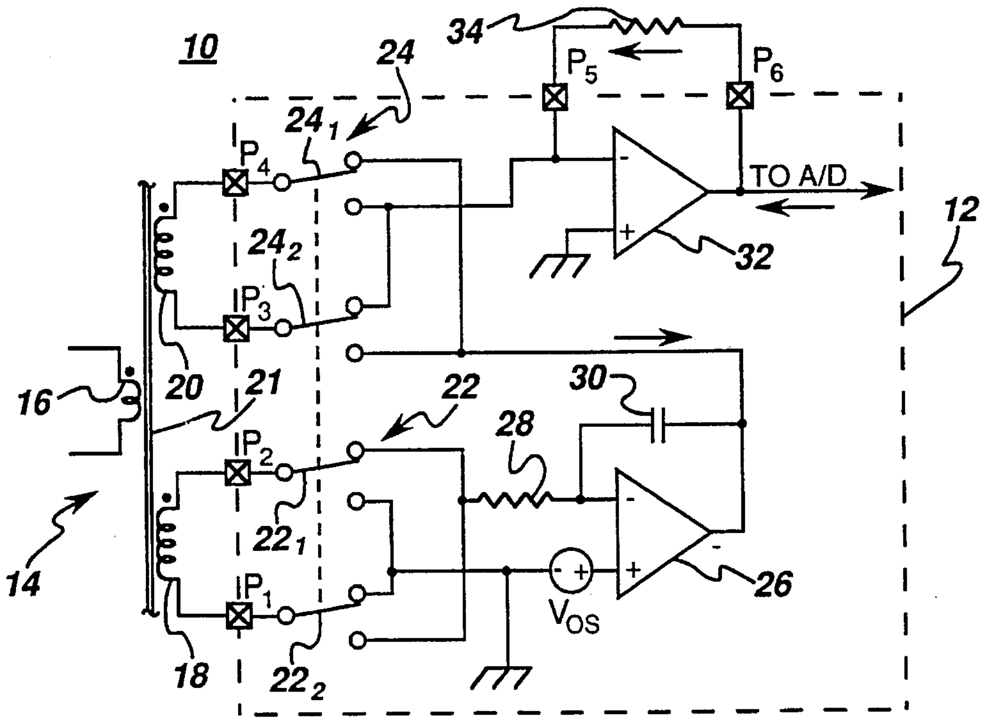
fig. 1A PRIOR ART
FIGS. 1A and 1B, respectively, are schematic diagrams of a prior art current sensor in respective first and second switching configurations.

FIG. 1 shows a prior art current sensor 10 including a feedback generating circuit 12 for overcoming the problem of magnetic core saturation in a transformer, such as a current transformer 14. The transformer includes a primary winding 16, a secondary winding 18 and a feedback winding 20, each respectively wound on a common core 21. The two ends or terminals of secondary winding 18 are connected via respective connect pins $P_1$ and $P_2$ to a first switching unit 22 made up of a pair of single-pole, double throw (SPDT) sampling switches $22_1$ and $22_2$. The pair of switches in practice are implemented with semiconductor switching devices but, for simplicity of illustration, are shown as mechanical switches.

FIG. 1A shows that during a first switching period, switches 221 and 222 respectively connect a respective one of the two ends of secondary winding 18 to a respective one of the two input ports of an operational amplifier 26. For example, as shown in FIG. 1A, during the first switching period the secondary winding end marked with a dot is connected through input resistor 28 to the inverting input port of operational amplifier 26 and the undotted secondary winding end is connected to the noninverting input port of operational amplifier 26. As used herein for the purposes of illustration and not of limitation, dot-polarity convention in transformer 14 is as follows: at the instant of time when current flows into a dotted end of one winding, such as secondary winding 18, current will be flowing out of the dotted end of the other winding, such as feedback winding 20. If desired, a feedback capacitor 30 together with input resistor 28 can be selected to provide an integration operation in operational amplifier 26 which allows for filtering any out-of-band signal therein.

Figure 1B:
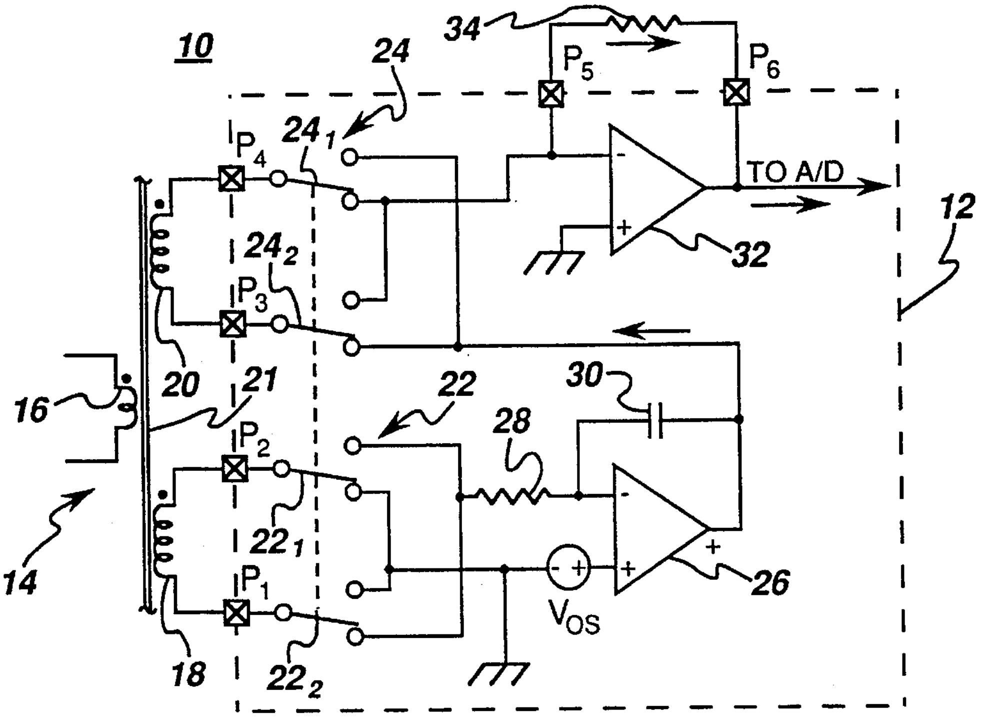
fig. 1B PRIOR ART

FIG. 1B, shows that during a second switching period, switches $22_1$ and $22_2$ respectively reverse the connections shown in FIG. 1A between the two ends of secondary winding 18 and the two input ports of operational amplifier 26. For example, as shown in FIG. 1B, during the second switching period the dotted secondary winding end is now connected to the noninverting input port of operational amplifier 26 while the undotted end of secondary winding 18 is connected to the inverting input port of operational amplifier 26.

In each case, the output signal of operational amplifier 26 is connected to feedback winding 20, and the output signal of feedback winding 20 is connected to an output amplifier 32 through a second switching unit 24 via connect pins $P_4$ and $P_3$. Switching unit 24 is made up of a pair of single-pole, double throw (SPDT) sampling switches $24_1$ and $24_2$. As previously suggested, the pair of switches in practice are implemented with semiconductor switching devices but, for simplicity of illustration, are shown as mechanical switches.

FIG. 1A shows that during the first switching period, switch $24_2$ connects a respective one of the two ends of feedback winding 20 to the inverting input port of output amplifier 32 and switch $24_1$ connects the other of the two ends of feedback winding 20 to receive the output signal from operational amplifier 26. For example, as shown in FIG. 1A, during the first switching period the dotted feedback winding end is connected to receive the output signal from operational amplifier 26 and the undotted feedback winding end is connected to the inverting input port of output amplifier 32.

FIG. 1B, shows that during the second switching period, switches $24_1$ and $24_2$ respectively reverse the connections shown in FIG. 1A between the two ends of feedback winding 20, the output port of operational amplifier 26 and the inverting input port of output amplifier 32. For example, as shown in FIG. 1B, during the second switching period the dotted feedback winding end is now connected to the inverting input port of output amplifier 32 while the undotted end of feedback winding 20 is connected to receive the output signal from operational amplifier 26. Output amplifier 32 includes a feedback resistor 34 connected between respective connect pins $P_5$ and $P_6$. The output signal from output amplifier 32 constitutes the desired measurement signal which can be conveniently passed to an analog-to-digital (A/D) converter (not shown) to be digitized therein, if desired.

It will be apparent to one skilled in the an that any DC offset voltage component (schematically represented by the voltage source $V_{os}$ connected to the noninverting input port of operational amplifier 26) in operational amplifier 26 is converted to a corresponding AC signal by the respective switching configurations of FIGS. 1A and 1B. The AC signal derived from the DC offset voltabe is coupled through transformer 14 back to operational amplifier 26 in a manner which produces a compensating signal to maintain the effect of DC offset substantially close to zero and thus prevent operational amplifier 26 from being driven into saturation. As indicated by the respective arrow direction in FIGS. 1A and 1B, it will be further apparent that during the first switching period the flow of current from output amplifier 32 will be opposite to the current flow during the second period. This opposite current flow, undesirably, causes discontinuous polarity reversal in the desired measurement signal and this necessitates additional synchronization or signal polarity "bookkeeping" in order to filter out or remove such discontinuous polarity reversal from the measurement signal.

Figure 2A:
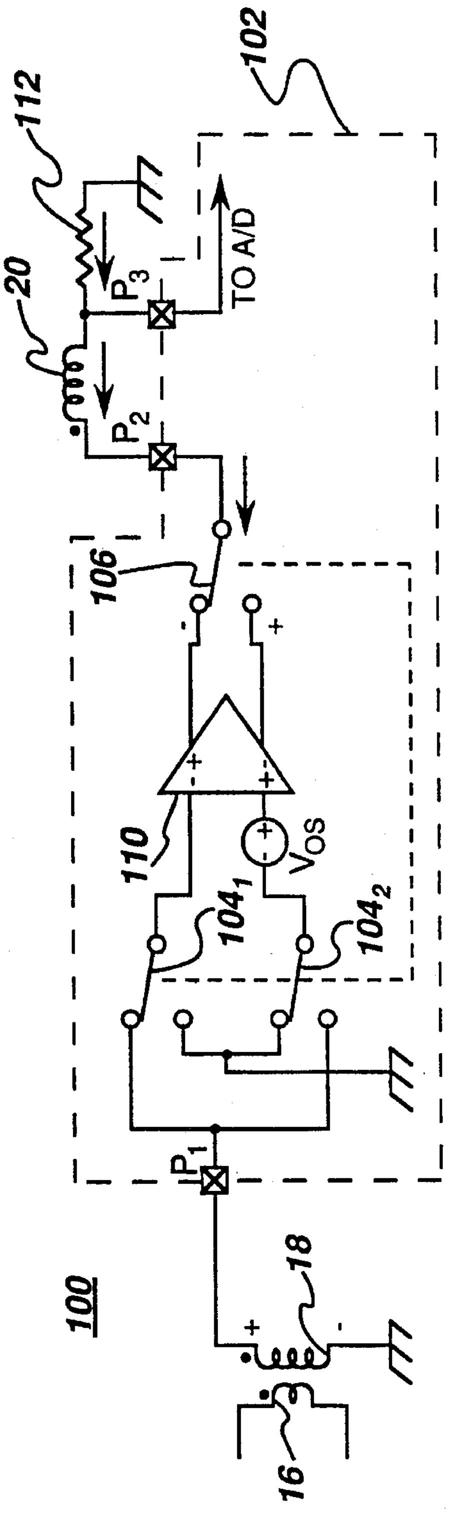
FIGS. 2A and 2B, respectively, are schematic diagrams of a current sensor according to one exemplary embodiment of the present invention in respective first and second switching configurations.
Figure 2B:
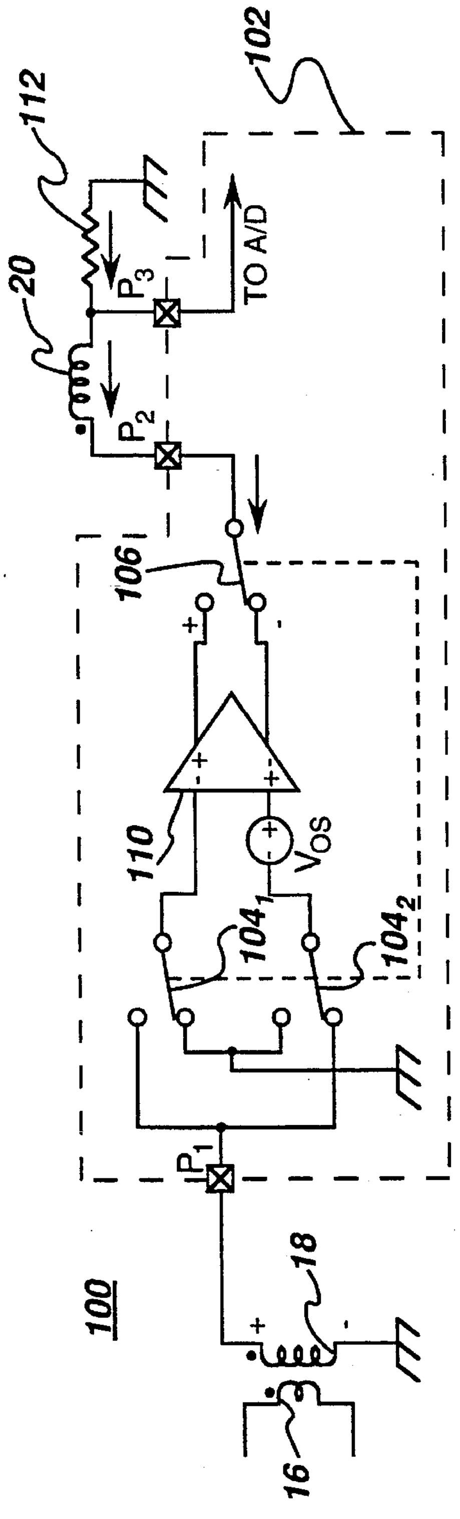

FIG. 2 shows an improved current sensor 100 having at least one signal interface channel in accordance with the present invention. Current sensor 100 includes a feedback generating circuit 102 for overcoming the above-described undesirable polarity reversal in the desired measurement signal. FIG. 2A corresponds to the first switching period described in the context of FIG. 1A while FIG. 2B corresponds to the second switching period described in the context of FIG. 1B. Although common core 21 (FIG. 1) is not shown in FIG. 2, it will be appreciated that the magnetic coupling in current sensor 100 is as described for transformer 14 in the context of FIG. 1. Feedback generating circuit 102 advantageously generates a substantially continuous feedback signal, i.e., a signal which is not subject to any undesirable polarity reversal and which consequently avoids the need of any additional synchronization or signal polarity "bookkeeping" of the desired measurement signal.

A switching assembly includes first and second input switches $104_1$ and $104_2$, (such as the SPDT sampling switches described in the context of FIG. 1) which respectively couple the dotted end of secondary winding 18 to pass any AC signal therein to the first and second differential input ports of an operational amplifier 110 through a first connect pin $P_1$. Operational amplifier 110 preferably comprises a fully differential operational amplifier, that is, an operational amplifier wherein each AC signal supplied at the two respective output ports is substantially 180° out-of-phase with respect to one another, when a differential input signal is applied at the two respective input ports of the operational amplifier. As shown in FIG. 2, during a given switching period, while a respective one of the two input ports is coupled to the dotted end of secondary winding 18, the other input port is connected to a predetermined electrical ground. The switching assembly further includes an output switch 106 (such as any of the SPDT sampling switches described in the context of FIG. 1) which periodically couples the first and second differential output ports of operational amplifier 110 to the dotted end of feedback winding 20 to pass the feedback signal therein through a second connect pin $P_2$. A third connect pin $P_3$ is conveniently connected to pass the measurement signal through a suitable scaling resistor 112, and, as previously suggested, to a suitable A/D converter (not shown).

It will be apparent to one skilled in the art that any DC offset voltage component in operational amplifier 110 is converted to a corresponding AC signal by the respective switching configurations of FIGS. 2A and 2B. The AC signal derived from the DC offset voltage is coupled through transformer 14 (FIG. 1) back to operational amplifier 110 in a manner which produces a compensating signal to maintain the effect of DC offset substantially close to zero and thus prevent operational amplifier 110 from being driven into saturation. As indicated by the respective arrow directions in FIGS. 2A and 2B, it will be further apparent that regardless of the switching period, the flow of current through the feedback winding is unidirectional. In accordance with a key advantage of the present invention, this unidirectional current flow conveniently eliminates discontinuous polarity reversal in the desired measurement signal and this avoids the need for additional synchronization or signal polarity "bookkeeping", as required in the current sensor of FIG. 1. As another advantage of the present invention, feedback generating circuit 102 may be constructed as a single monolithic integrated circuit chip which includes a pin set employing only three connect pins, such as connect pins $P_1$, $P_2$ and $P_3$, for the one signal interface channel in FIG. 2. This is a relatively significant reduction over the six pins utilized in the prior art current sensor discussed in the context of FIG. 1. This pin reduction conveniently allows for incorporating additional interface channels in the integrated circuit chip being that each additional signal interface channel only requires three connect pins per channel.

Figure 3A:
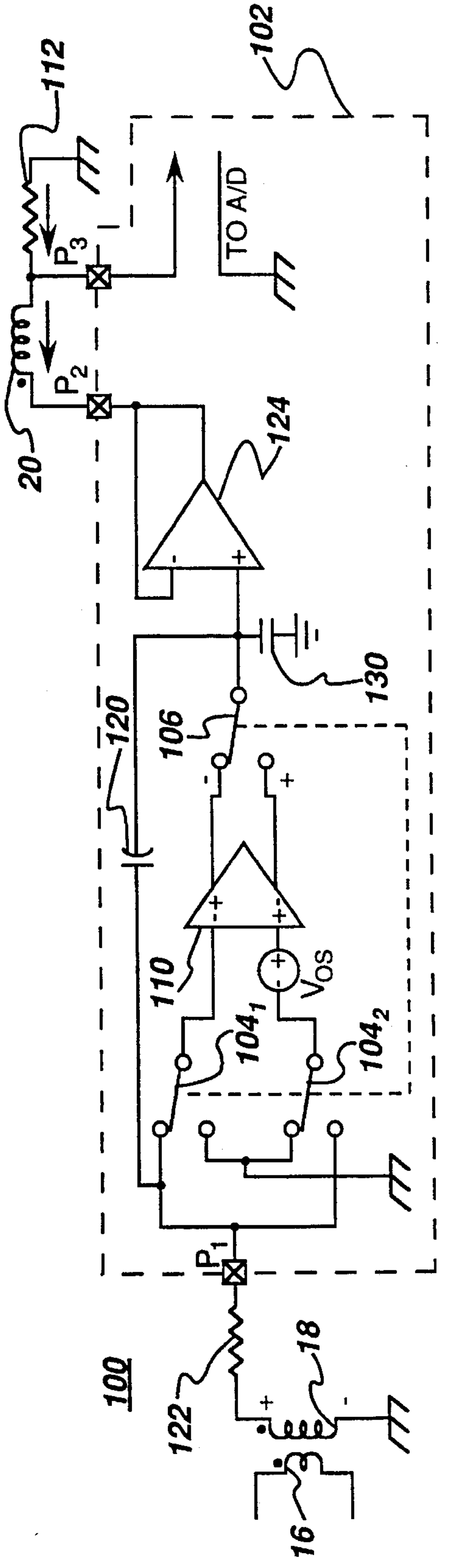
FIGS. 3A and 3B, respectively, are schematic diagrams of a current sensor according to another exemplary embodiment of the present invention in respective first and second switching configurations.
Figure 3B:
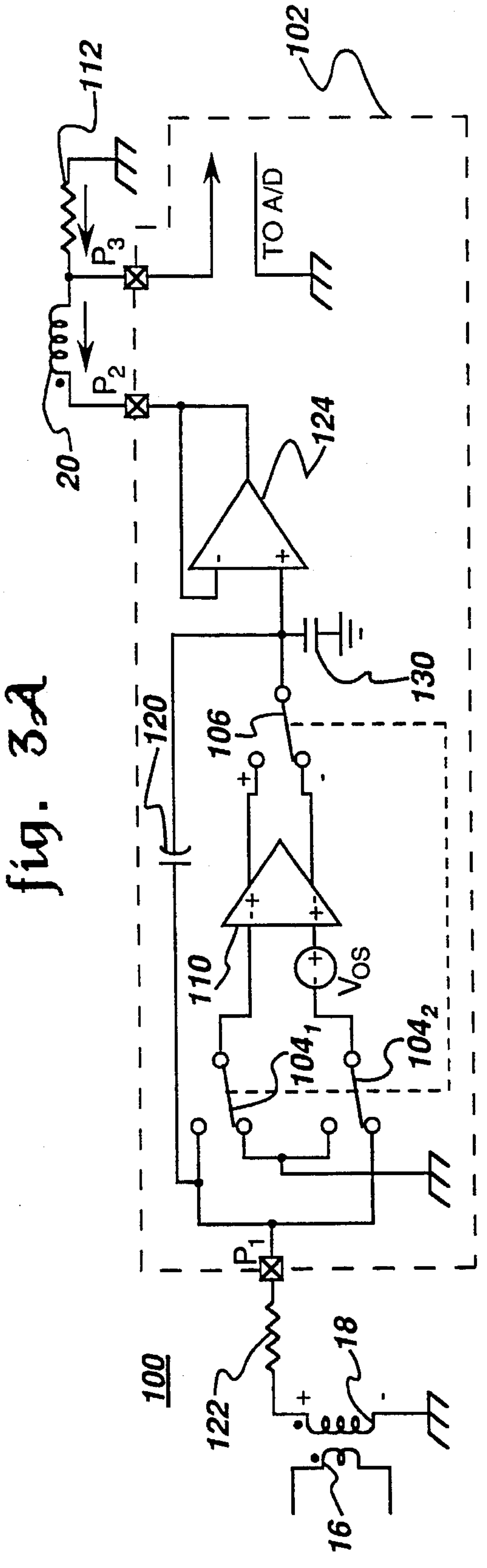

FIG. 3 shows another exemplary embodiment of current sensor 100. FIG. 3A corresponds to the first switching period described in the context of FIGS. 1A and 2A while FIG. 3B corresponds to the second switching period described in the context of FIGS. 1B and 2B. In this embodiment, operational amplifier 110 includes feedback capacitor means, such as feedback capacitor 120 and an input resistor 122 having respective values chosen to provide a desired frequency response in operational amplifier 110. For example, the frequency response can be conveniently compensated to provide substantially stable operation of the feedback generating circuit. Optionally, this embodiment may include a buffer amplifier 124 between second connect pin $P_2$ and output switch 106. A capacitor 130 has one terminal thereof connected to the noninverting terminal of buffer amplifier 124 and the other terminal thereof connected to ground. It will be appreciated that the additional components shown in FIG. 3 provide convenient means for improving the overall stability of the feedback generating circuit depending on any specific design implementation.

Figure 4:
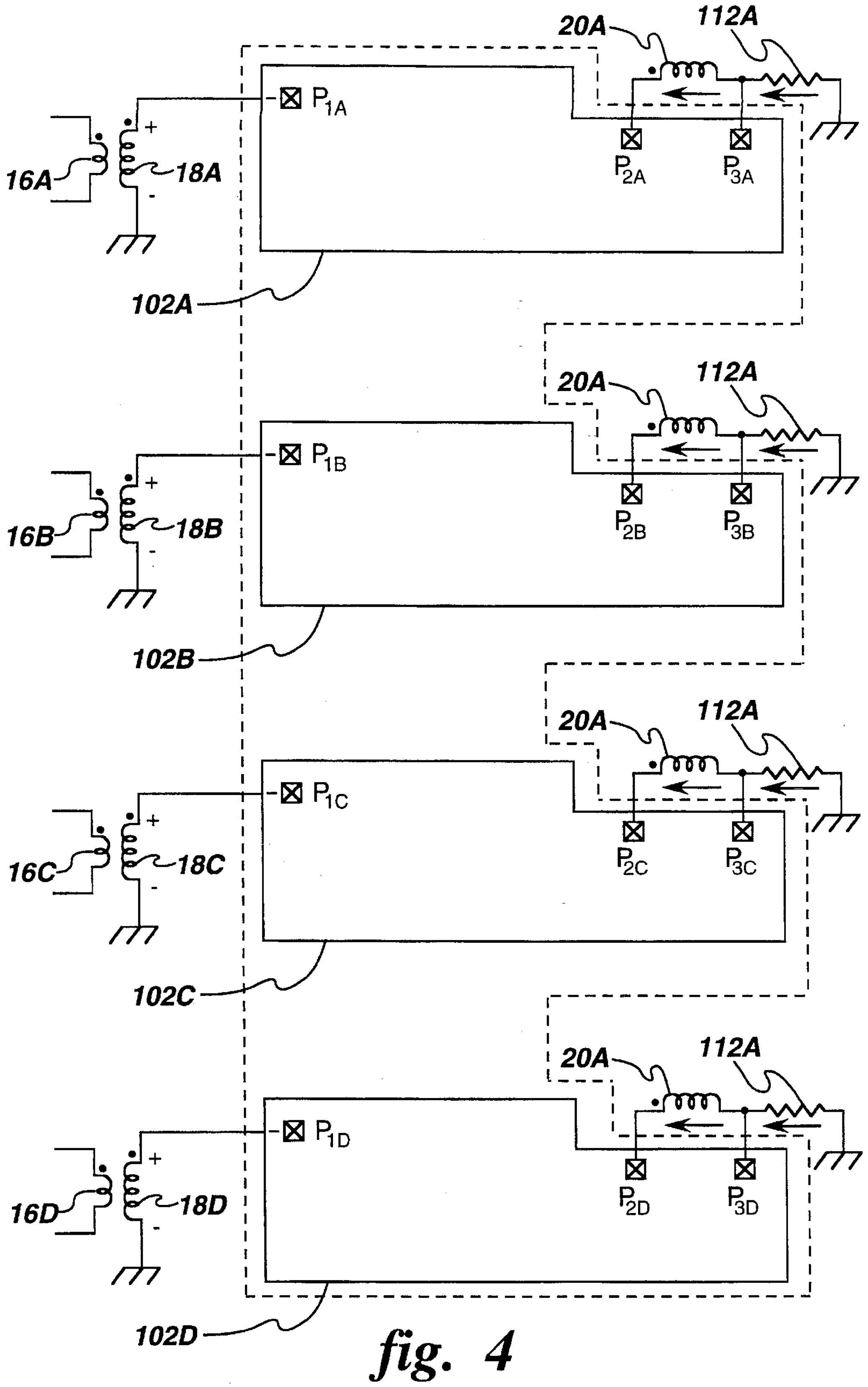
FIG. 4 is a block diagram of four interfaced channels of the invention incorporated on a single integrated circuit chip.

FIG. 4 illustrates four interface channels including feedback generating circuits 102A, 102B, 102C and 102D, respectively, on a single integrated circuit chip in accordance with the invention. Each of feedback generating circuits 102A, 102B, 102C and 102E is identical to feedback generating circuit 102 in FIGS. 2A, 2B, 3A and 3C. Since only three connect pins are required per channel (i.e., pins $P_{1A}$, $P_{2A}$, and $P_{3A}$ in interface channel 102A, pins $P_{1B}$, $P_{2B}$, and $P_{3B}$ in interface channel 102B, etc.) it is convenient to incorporate all four channels onto a single chip. Similarly, transformer windings 16A, 18A and 20A together with scaling resistor 112A are associated with feedback generating circuit 102A, transformer windings 16B, 18B and 20B together with scaling resistor 112B are associated with feedback generating circuit 102B, etc.

A method for signal compensation in a current sensor may comprise the steps of magnetically coupling a primary winding, a secondary winding and a feedback winding using a magnetic core. A substantially continuous feedback signal is generated and is supplied to the feedback winding for effectively maintaining a magnetic flux substantially near zero. A compensating AC signal is generated from a DC offset voltage. The compensating signal is predeterminedly coupled through the magnetic core. The step of generating the substantially continuous feedback signal comprises operating an operational amplifier having first and second differential input ports and first and second differential output ports. For example, during a first switching period the first input port (e.g., the inverting input port of operational amplifier 110) is coupled to the secondary winding through its dotted end while the second input port (e.g., the noninverting input port of operational amplifier 110) is coupled to a predetermined electrical ground. Conversely, during a second switching period the first input port is coupled to the predetermined electrical ground while the second input port is coupled to the dotted secondary winding end. The step of operating the operational amplifier further comprises coupling during the first switching period the first output port (e.g., the output port shown in FIG. 2A connected to output switch 106) to the feedback winding through its dotted end, and coupling during the second switching period the second output port (e.g., the output port shown in FIG. 2B connected to output switch 106) to the feedback winding through its dotted end.

While only certain features of the invention have been illustrated and .described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A current sensor having at least one signal interface channel comprising:

a transformer having a primary winding, a secondary winding and a feedback winding;

a magnetic core to magnetically couple said primary winding, said secondary winding and said feedback winding; and a feedback generating circuit responsive to an AC signal in said secondary winding for supplying a feedback signal to said feedback winding, said feedback signal being free of any polarity reversal and effective for maintaining a flux in said magnetic core substantially near zero;

said feedback generating circuit comprising:

an operational amplifier having a first differential input port, a second differential input port at which a DC offset voltage may develop, and first and second differential output pores; and a switching assembly coupling said feedback winding to said first and second differential output ports and adapted to generate a compensating AC signal from said DC offset voltage, said compensating AC signal being coupled to the first and second differential input ports of said operational amplifier through said primary and secondary windings.

2. The current sensor of claim 1 wherein said switching assembly comprises:

first and second input switches for respectively coupling during a first switching period the first input port to said secondary winding and the second input port to a predetermined electrical ground, and for respectively coupling during a second switching period the second input port to said secondary winding and the first input port to the predetermined electrical ground; and an output switch for coupling during the first switching period the first output port to said feedback winding, said output switch coupling during the second switching period the second output port to said feedback winding.

3. The current sensor of claim 2 wherein said feedback generating circuit comprises a single monolithic electronic integrated circuit chip.

4. The current sensor of claim 3 wherein said integrated circuit chip includes a pin set comprising three connect pins for said one signal interface channel.

5. The current sensor of claim 4 wherein the first one of said three connect pins is connected to pass the AC signal in said secondary, winding, the second one of said three connect pins is connected to pass the feedback signal in said feedback winding and the third one of said three connect pins is connected to pass a predetermined measurement signal.

6. The current sensor of claim 4 wherein said operational amplifier has feedback capacitor means for predeterminedly compensating frequency response of said operational amplifier.

7. The current sensor of claim 6 further comprising respective additional signal interface channels substantially similar to said one signal interface channel and wherein said integrated circuit chip includes a respective additional pin set comprising three connect pins per each additional signal interface channel therein.

8. The current sensor of claim 1 wherein said feedback generating circuit comprises a single monolithic electronic integrated circuit.

9. In a current sensor having one signal interface channel including a respective transformer having a primary winding, a secondary winding and a feedback winding each being magnetically coupled to each other through a common magnetic core, a feedback generating circuit responsive to an AC signal in said secondary winding for supplying a feedback signal to said feedback winding, said feedback signal being free of any polarity reversal and effective for maintaining a flux in said magnetic core substantially near zero, said feedback generating circuit comprising:

an operational amplifier having a first differential input port, a second differential input port at which a DC offset voltage may develop, and first and second differential output ports; and a switching assembly adapted to generate a compensating AC signal from said DC offset voltage, said compensating AC signal being coupled to said operational amplifier through said primary and secondary windings;

said switching assembly comprising:

first and second input switches for respectively coupling during a first switching period the first input port to said secondary winding and the second input port to a predetermined electrical ground, and for respectively coupling during a second switching period the second input port to said secondary winding and the first input port to the predetermined electrical ground; and an output switch for coupling during the first switching period the first output port to said feedback winding, said output switch coupling during the second switching period the second output port to said feedback winding.

10. The feedback generating circuit of claim 9 wherein said said feedback generating circuit comprises a single monolithic electronic integrated circuit.

11. The feedback generating circuit of claim 10 wherein said integrated circuit chip includes a pin set comprising three connect pins for said one signal interface channel.

12. The feedback generating circuit of claim 11 wherein the first one of said three connect pins is connected to pass the AC signal in said secondary winding, the second one of said three connect pins is connected to pass the feedback signal in said feedback winding and the third one of said three connect pins is connected to pass a predetermined measurement signal.

13. The feedback generating circuit of claim 12 wherein said integrated circuit chip includes respective additional feedback generating circuits for respective additional signal interface channels in said current sensor and wherein said integrated circuit chip includes a respective additional pin set comprising three connect pins per each additional signal interface channel therein.

14. The feedback generating circuit of claim 13 wherein said operational amplifier has at least one feedback capacitor for predeterminedly compensating frequency response of said operational amplifier.

15. A method for signal compensation in a current sensor comprising:

magnetically coupling a primary winding, a secondary winding and a feedback winding;

generating a feedback signal free of any polarity reversal, said feedback signal being supplied to said feedback winding and being effective for maintaining a magnetic flux substantially near zero by operating an operational amplifier having a first differential input port, a second differential input port at which a DC offset voltage may develop, and first and second differential output ports from which said feedback signal is produced; and generating a compensating AC signal from said DC offset voltage, said compensating signal being predeterminedly coupled to the first and second differential input ports of said operational amplifier through said primary and secondary windings.

16. The method of claim 15 wherein the step of operating the operational amplifier comprises coupling during a first switching period the first input port to said secondary winding and the second input port to a predetermined electrical ground, and coupling during a second switching period the second input port to said secondary winding and the first input port to the predetermined electrical ground.

17. The method of claim 16 wherein the step of operating the operational amplifier further comprises coupling during the first switching period the first output port to the feedback winding and coupling during the second switching period the second output port to the feedback winding.

18. In a current sensor having one signal interface channel including a respective transformer having a primary winding, a secondary winding and a feedback winding each being magnetically coupled to each other through a common magnetic core, a feedback generating circuit responsive to an AC signal in said secondary winding for supplying a feedback signal to said feedback winding, said feedback signal being free of any polarity reversal and effective for maintaining a flux in said magnetic core substantially near zero, said feedback generating circuit comprising:

an operational amplifier having a first differential input port, a second differential input port at which a DC offset voltage may develop, and first and second differential output ports; and a switching assembly adapted to generate a compensating AC signal from said DC offset voltage, said compensating AC signal being coupled to said operational amplifier through said primary and secondary windings;

said switching assembly comprising:

first and second input switches for respectively coupling during a first switching period the first input port to said secondary winding and the second input port to a predetermined electrical ground, and for respectively coupling during a second switching period the second input port to said secondary winding and the first input port to the predetermined electrical ground; and an output switch for coupling during the first switching period the first output to said feedback winding, said output switch coupling during the second switching period the second output port to said feedback winding.

* * * * *